United States Patent [19]

Matsuda et al.

[11] Patent Number: 5,098,674
[45] Date of Patent: Mar. 24, 1992

[54] POWDER SUPPLY DEVICE AND METHOD FOR A SINGLE CRYSTAL PULLING APPARATUS

[75] Inventors: Masato Matsuda, Nagai; Osamu Suzuki, Nishi-Kitama; Yasuo Wakasa, Nishi-Okitama; Nobuyuki Sato, Nishi-Kitama, all of Japan

[73] Assignee: Toshiba Ceramics Co., Ltd., Tokyo, Japan

[21] Appl. No.: 590,590

[22] Filed: Sep. 27, 1990

Related U.S. Application Data

[63] Continuation of Ser. No. 278,715, Dec. 2, 1988, abandoned.

[30] Foreign Application Priority Data

Dec. 3, 1987 [JP] Japan .................. 62-306168
Dec. 3, 1987 [JP] Japan .................. 62-306169

[51] Int. Cl.⁵ ............................ C30B 15/02
[52] U.S. Cl. .................. 422/249; 156/617.1; 156/618.1; 156/620.4; 156/DIG. 64; 156/DIG. 115
[58] Field of Search ............... 422/249; 156/605, 608, 156/617.1, 618.1, 620.4, DIG. 64, DIG. 115

[56] References Cited

U.S. PATENT DOCUMENTS

| | | | |
|---|---|---|---|
| 2,809,136 | 10/1957 | Mortimer | 422/249 |
| 2,892,739 | 6/1959 | Rusler | 422/249 |
| 3,265,469 | 8/1966 | Hall | 422/249 |
| 4,203,951 | 5/1980 | Goriletsky et al. | 422/249 |
| 4,330,362 | 5/1982 | Zulehner | 422/249 |
| 4,456,499 | 6/1984 | Lin | 156/605 |
| 4,698,120 | 10/1987 | Higginbotham | 156/608 |

FOREIGN PATENT DOCUMENTS

| | | | |
|---|---|---|---|
| 69821 | 1/1983 | European Pat. Off. | 156/620.4 |
| 59-8695 | 1/1984 | Japan | 422/249 |
| 60-27693 | 2/1985 | Japan | 156/618.1 |
| 8606764 | 11/1986 | PCT Int'l Appl. | 156/DIG. 64 |
| 1011973 | 12/1965 | United Kingdom | 156/617.1 |

*Primary Examiner*—Robert Kunemund
*Attorney, Agent, or Firm*—Foley & Lardner

[57] ABSTRACT

Apparatus for supplying powder to a crucible containing a molten crystal component in a single crystal pulling device. The apparatus includes a separating member for separating the space above the surface of the molten crystal component into a first and second region, a feeding device for feeding the powder into the first region and a supporting device for supporting the separating device. The single crystal is pulled from the molten crystal component in the second region.

16 Claims, 3 Drawing Sheets

POWDER SUPPLY DEVICE AND METHOD FOR A SINGLE CRYSTAL PULLING APPARATUS

This application is a continuation of application Ser. No. 07/278,715, filed Dec. 2, 1988, now abandoned.

BACKGROUND OF THE INVENTION

This invention relates to a powder supply element particularly to an element for supplying polycrystalline silicon powder continuously into a crucible for use in a single crystal pulling apparatus.

Silicon single crystals are made by the conventional Czochralski method (CZ method). According to this method, a crucible is provided within a vacuum melting furnace in a single crystal pulling apparatus. Polycrystalline silicon in the crucible is heated into molten silicon by an annular heater which surrounds the crucible With pulling of a single crystal, polycrystalline silicon powder is supplied into the crucible so as to maintain a fixed height of the liquid surface of the molten silicon and to maintain the impurity concentration of the molten silicon constant (For example, the apparatus as described in Japanese Patent Application No. 103918/86 filed on May 8, 1986 may be used).

However, since the silicon polycrystal powder to be supplied has a particle size ranging from about 100 microns to about 3 mm, part of the fine particles after being ejected from a supplying pipe will be suspend in the air and reach the vicinity of the solid-liquid interface of the single crystal without falling directly onto the liquid surface of the molten silicon in the crucible. As a result, the uniformity of the crystal being grown deteriorates. Further, some part of coarse particles of the powder will reach the vicinity of the solid-liquid interface in a solid state without melting promptly.

The heat generated by the heater is transmitted from the side peripheral portion of the crucible and heat convection takes place in the molten crystal component. The current directions of the heat convection are an upward direction near the side peripheral portion of the crucible, an inward direction near the liquid surface of the molten crystal component, a downward direction near the central axis of the crucible and an outward direction near the bottom of the crucible, respectively, whereby the heat transmitted from the heater to the molten crystal component through the side peripheral portion of the crucible can be quickly transmitted toward the center of the crucible. Therefore, a temperature at the liquid surface of the molten crystal component is near a temperature at a solid-liquid interface of the single crystal in the crucible. Thus, the polycrystalline component powder cannot be quickly melted. Nonmelted powder is apt to be mixed with the single crystal while it is being pulled so that the quality of the single crystal decreases.

SUMMARY OF THE INVENTION

The object of the present invention is to provide a pulling element whereby a powder to be supplied into a crucible for a single crystal pulling equipment can be dropped directly onto the liquid surface of a molten crystal component in the crucible while preventing the powder from floating in the air up to the vicinity of a solid-liquid interface of a single crystal to be pulled.

And it is also the object of the present invention to provide a separating device for a single crystal pulling apparatus in which a surface portion of the molten crystal component in the crucible can be prevented from flowing in the molten crystal component toward the center of the crucible.

The invention is directed toward an apparatus for supplying powder to a crucible containing a molten crystal component in a single crystal pulling device comprising means for separating the space above the surface of the molten crystal component into a first and second region, means for feeding the powder to the first region, the second region provided for pulling a single crystal from the molten crystal component, and means for supporting the separating means.

Preferably, the separating means and supporting means are made of high pure quartz, and the supporting means comprise plural rods.

More preferably, the separating means comprise a plate member which is rectangular in shape and disposed vertically. The plate member is fixed to a powder supply pipe with the supporting means between the plate member and the pipe. Both side edges of the separating means are close to but spaced from the inner peripheral surface of the crucible. The upper edge of the plate member is positioned above the opening end of the pipe, and the lower edge of the plate member is positioned lower than a height corresponding to the particle diameter of the supplied powder from the liquid surface of the molten crystal component. In this case, the powder supplied from the pipe can be prevented from floating in the air up to the vicinity of the solid-liquid interface, and it is possible to prevent the powder floating on the liquid surface form shifting up to the solid-liquid interface. The lower edge of the plate member may be positioned below or immersed into the liquid surface in the crucible. In this case, powder supplied from the pipe can be prevented from floating in the air and on the liquid surface up to the vicinity of the solid-liquid interface. The liquid surface and the space for supplying the crystal material can be held at a high temperature by the heat generated from a heater disposed along the side peripheral portion of the crucible. Thus, the powder supplied from the pipe can be melted quickly.

The plate member may be a semi-cylindrical member which is cut along a longitudinal plane including the diameter thereof. The semi-cylindrical member has a radius of curvature not larger than 80 mm, preferably 40 mm, if the inside diameter of the crucible is 16 inches.

The plate member may be a semi-elliptical member which is cut along a longitudinal plane including the major axis.

Preferably also, the separating means may comprise an annular wall the inner diameter of which is larger than the diameter of the single crystal to be pulled. The annular wall is placed coaxial with the crucible, has a lower end positioned below the liquid surface of the molten crystal component, and is fixed to the crucible with the supporting means between the annular wall and the crucible.

The inner diameter of the annular wall is larger than the diameter of the single crystal to be pulled, by 160–240 mm, preferably 200 mm.

The annular wall may comprise a plurality of rings, preferably two rings, which are placed coaxial with the crucible in multi-arrangement.

BRIEF DESCRIPTION OF THE DRAWINGS

By way of examples and to make the description more clear, reference is made to the accompanying drawings in which.

DETAILED DESCRIPTION OF THE PREFERRED EMBODIMENTS

Figure 1:
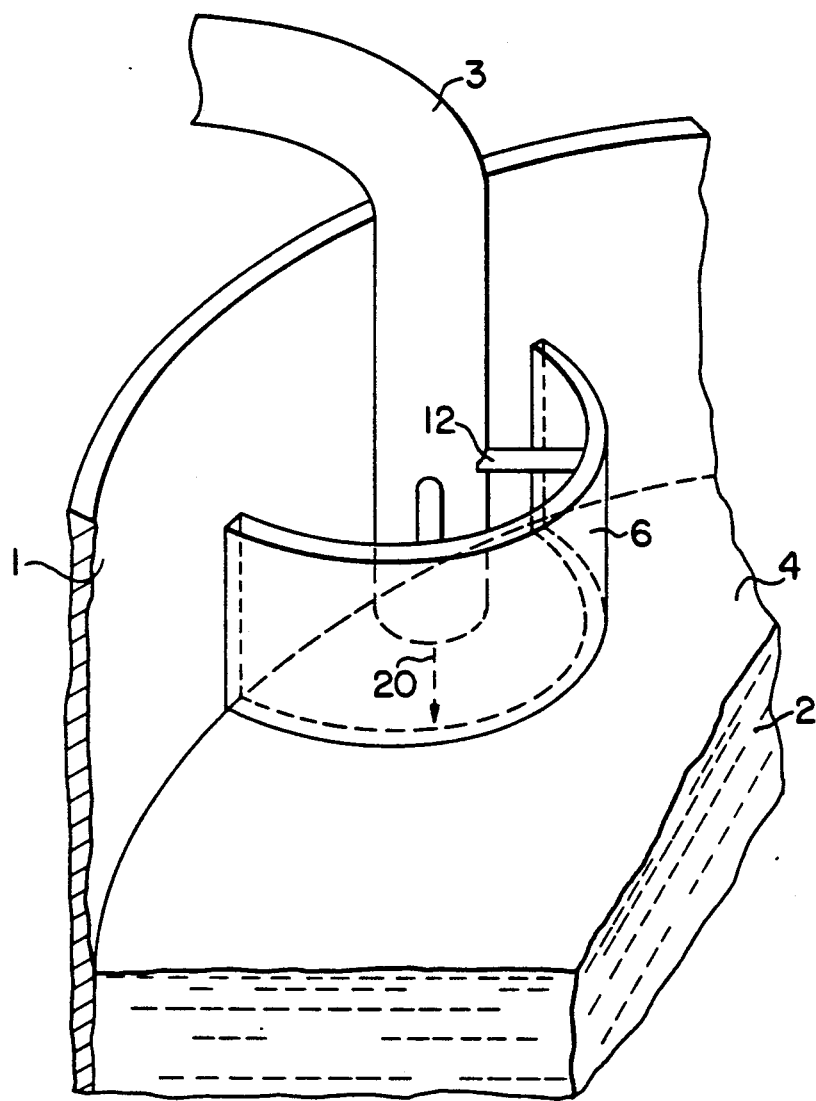
FIG. 1 is a perspective view showing a pulling element according to an embodiment of the present invention.

Referring now to the drawings, preferred embodiments of the present invention will be explained in detail.

In FIG. 1, an annular heater (not shown) is disposed around a cylindrical quartz crucible (cup-shaped crucible) 1 which is mounted in a vacuum within a vacuum melting furnace for use in a single crystal pulling apparatus. The inside diameter of the crucible 1 is 16 inches. Polycrystalline silicon contained in the crucible 1 is melted by the heat generated from the heater thereby to provide molten silicon 2 as a molten crystal component. In order to maintain the impurity concentration of the molten silicon 2 constant, a polycrystalline silicon powder supply means (not shown) supplies a polycrystalline silicon powder (crystal material) to a liquid surface 4 of the molten silicon 2 as indicated by arrow 20 through crystal material supplying pipe 3 made of quartz and having a bore diameter of 10 mm. The distal end of the pipe 3 is positioned near the peripheral portion of the crucible 1. The spacing between the open end of the pipe 3 and the liquid surface 4 is 20 mm. The particle size distribution of the powder supplied is from about 100 microns to about 3 mm.

A semi-cylindrical member 6 made of quartz and serving as a separate means is fixed by means of quartz rods 12 to an end portion of the pipe 3 so as to partially enclose the pipe 3 which is disposed above the liquid surface 4. The semi-cylindrical member 6 separates the space above the liquid surface into two. The separated space which includes the pipe 3 is the space for supplying the crystal material and the other separated space is the space for pulling a single crystal. The pipe 3 and the semi-cylindrical member 6 are fixed to the rods 12 by welding.

Preferably, the semi-cylindrical member 6 has a radius of curvature of 40 mm, a height of 50 mm and a plate thickness of 3 mm. The diameter of each rod 12 is 5 mm.

The semi-cylindrical member 6 is disposed in such a manner that a slight spacing is formed between each of both side edges of the semi-cylindrical member 6 and the inner peripheral surface of the crucible 1. The spacing between the lower edge of the semi-cylindrical member 6 and the liquid surface 4 is smaller than the diameter of fine particle contained in the powder supplied. As a result, not only the rotation of the crucible 1 is permitted but also the powder from the pipe 3 can be prevented from floating in the air outside the semi-cylindrical member 6, that is , coming up to the solid-liquid interface of a single crystal (not shown) to be pulled up.

The lower edge of the semi-cylindrical member 6 may be immersed, preferably 5 mm, into the molten crystal component 2. By doing so, not only the rotation of crucible 1 can be permitted but also the powder from the pipe 3 can be prevented from floating in the air or on the liquid surface 4 outside the semi-cylindrical member 6, that is, coming up to the solid-liquid interface of a single crystal (not shown) to be pulled up. In addition, the molten silicon 2 located inside the semi-cylindrical member 6 can be held at a high temperature by the heat generated by the heater. Thus, the powder supplied from the pipe 3 can be melted quickly.

Figure 2:
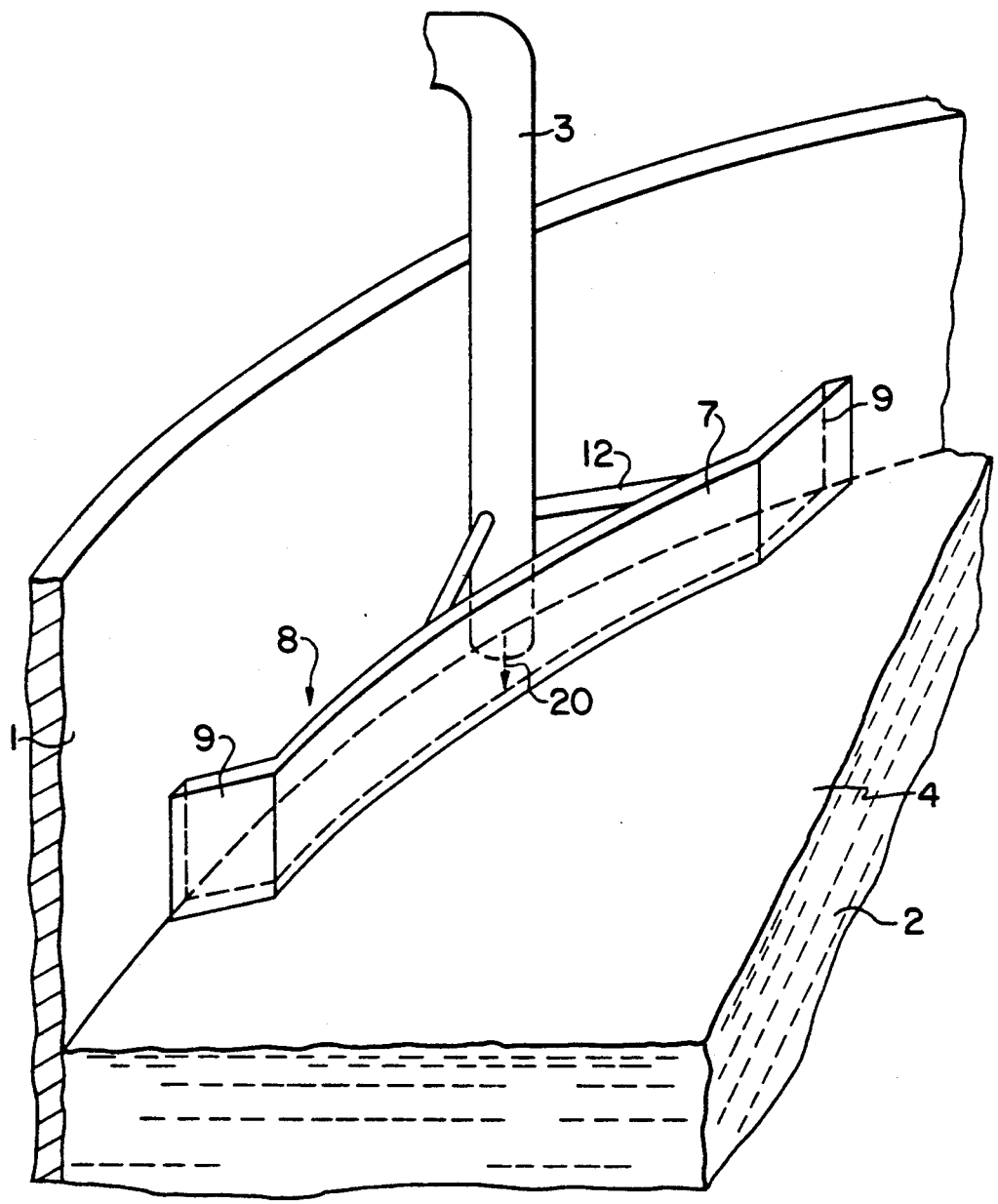
FIG. 2 is a perspective view showing another embodiment of the present invention.

Another embodiment of the invention will now be described with reference to FIG. 2. In FIG. 2, the same members as in FIG. 1 are indicated by the same reference numerals, and explanation on their structure and function will be omitted.

In FIG. 2, a curved plate 8 made of quartz and serving as a separate means has a radius of curvature of about 180 mm, a horizontal length of 150 mm, a height of 40 mm and a plate thickness of 3 mm. It comprises an arcuate plate portion 7 disposed vertically and coaxially with the crucible 1, and two flat plate portions 9 and 9' which are respectively provided at both side ends of the arcuate portion 7 integrally and obliquely toward the outer peripheral side of the arcuate plate portion 7. The flat plate portions 9 and 9' each has a horizontal length of 30 mm, a height of 40 mm and a plate thickness of 3 mm. The arcuate plate portion 7 is fixed to the pipe 3 by means of the rods 12 and separates the space above the liquid surface 4 into two. The separated space which includes the pipe 3 is the space for supplying the crystal material and the other is for pulling the single crystal. Spacing between the crucible 1 and the arcuate plate portion 7 is disposed in such a way that a slight spacing is formed between each of the side edges of the flat plate portions 9, 9' and the inner peripheral surface of the crucible 1. The lower edge of the curved plate 8 is immersed, preferably 5 mm, into the molten crystal component 2.

The embodiment of FIG. 2 has the same effects as those attained by the material supplying pipe of FIG. 1. In addition, the curved plate 8 has a further effect that the molten crystal component 2 can rotate smoothly with respect to the curved plate portion 7 with rotation of the crucible 1, because the arcuate plate portion 7 is provided along the circumference of the crucible 1.

Figure 3:
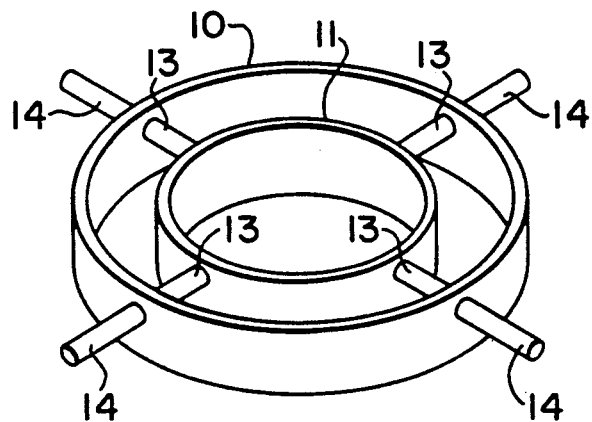
FIG. 3 is a perspective view showing yet another embodiment of the present invention.

In FIG. 3, an outer ring (annular wall) 10 is made of quartz and has a thickness of 3 mm, an inner diameter of 375 mm and a height of 20 mm. An inner ring (annular wall) 11 is made of quartz and has a thickness of 3 mm, a inner diameter of 325 mm and a height of 20 mm. The inner ring 11 is arranged coaxial with the outer ring 10. The outer ring 10 and the inner ring 11 are fixed by four rods 13 made of quartz which are placed at regular intervals. The diameter of each rod is 5 mm. The rods 13 are fixed to the rings 10, 11 by welding. Four rods 14 are fixed to the outer peripheral surface of the outer ring 10 at the positions corresponding to the rods 13, respectively, by welding means. The rods 13, 14 extend in radial directions. The rods 14 each has a diameter of 5 mm and is made of quartz.

Figure 4:
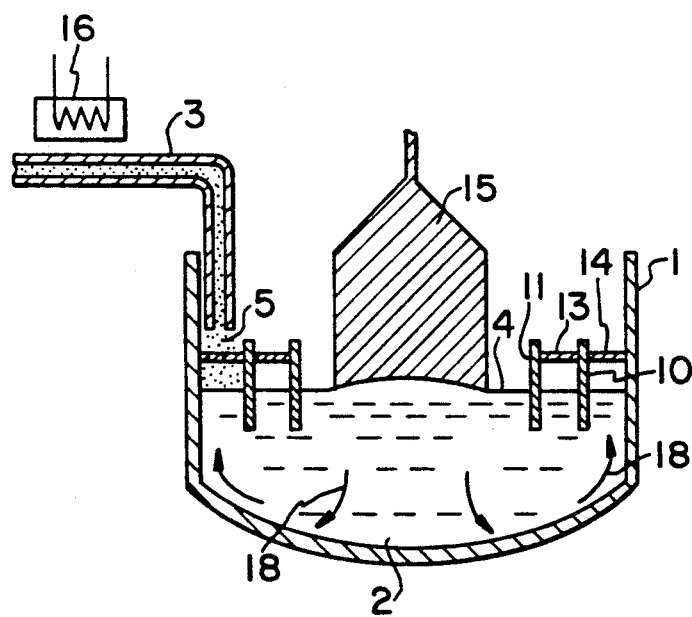
FIG. 4 is a vertical sectional view showing the setting of the pulling element according to an embodiment of the present invention.

As shown in FIG. 4, the rings 10, 11 are supported in the crucible 1, for example, by fixing the ends of the rods 14 onto the inner peripheral surface of the crucible 1 by welding.

Figure 5:
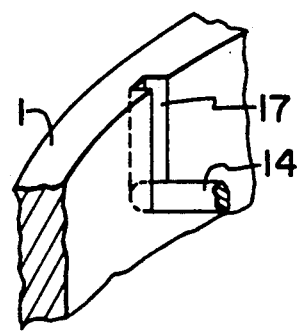
FIG. 5 is a partial cutaway view showing a modification of the setting shown in FIG. 4.

Alternately, as shown in FIG. 5, the ends of the rods 14 can be inserted into a corresponding groove 17 formed in the crucible 1 to thereby be fixed in place.

In any fixing mode of the rods 14, the rings 10, 11 are positioned in a vertical direction such that the liquid surface 4 of the molten crystal component 2 in the crucible comes to a half of the height of the rings 10, 11, and the rings separate the space above the liquid surface 4 into three. The separated space which includes the pipe 3 is the space for supplying the crystal material and another which includes the center of the crucible 1 is for pulling the single crystal.

The liquid surface 4 is controlled so as to be maintained at a constant level thereby to prevent the liquid surface 2 from moving downward while the molten silicon is changed into a solid state in pulling the single crystal 15. For example, a controlled amount of polycrystalline silicon powder 5 is supplied through a pipe 3 into the crucible 1, by means of a polycrystalline silicon powder supply means (not shown). The distance between the bottom of the crucible 1 and the lower end of the rings 10, 11 is set in such a way that the heat convection of molten silicon 2 located below the lower end of the rings 10, 11 can take place without restriction within the whole horizontal sectional area of the molten silicon 2 as denoted by the arrows 18 in FIG. 4. The particle size distribution of the powder 5 ranges between about 100 microns and about 3 mm.

An electric heater 16 is provided near an intermediate portion of the pipe 3 for heating the powder 5 which is being transferred through the pipe 3 whereby the powder 5 can be easily melted in the crucible 1.

The operation of the crucible and its related members will now be explained.

When the annular heater (not shown) around the crucible 1 generates heat, the heat convection current 18 is produced in the molten crystal silicon or component 2 within the crucible 1. Because the rings 10, 11 are immersed in the molten component 2 by about 10 mm, the heat convection in the inward direction at the surface portion of the molten crystal component 2 can be prevented from taking place by means of the rings 10, 11. Therefore, the heat transmitted from the heater to the molten crystal component 2 through the side peripheral portion of the crucible 1 can be prevented from being transmitted to near the solid-liquid interface of the single crystal 15 to be pulled. As a result, the temperature increases particularly at a surface portion of the molten crystal component 2 located between the outer surface of the ring 10 and the inner surface of the crucible Thus, when the powder 5 is supplied through the pipe 3 into a space between the ring 10 and the crucible 1 as shown in FIG. 4, the powder can be easily melted in the surface portion of the molten crystal component.

Having described the invention as related to the embodiment shown in the accompanying drawings, it is clear that the invention is not limited by any of the details of description, unless otherwise specified, but rather the invention is to be construed broadly within its spirit and scope as set out in the accompanying claims.

What is claimed is:

1. Apparatus for supplying powder to a crucible containing a molten crystal component in a single crystal pulling device comprising:
    a) means for separating the space above the surface of the molten crystal component into first and second regions, said separating means having two side edges each spacedly positioned adjacent an inner peripheral surface of said crucible,
    b) means for feeding powder to said first region of the space above the surface of the molten crystal component defined by said separating means, said second region provided for pulling a single crystal from said molten crystal component, wherein an upper edge of said separating means is positioned above a lower end of said feeding means, and
    c) means for supporting said separating means, said supporting means securing said separating means to said feeding means.

2. Apparatus according to claim 1, wherein the separating means and the supporting means are made of quartz.

3. Apparatus according to claim 1, wherein the separating means comprise a rectangular plate member which is disposed vertically and said feeding means comprises a pipe.

4. Apparatus according to claim 3, wherein said supporting means comprises a plurality of rods connected between said plate member and pipe.

5. Apparatus according to claim 4, wherein the upper edge of the plate member is positioned above the open end of the pipe, and the lower edge of the plate member is positioned lower than a height corresponding to the particle diameter of the powder from the surface of the molten crystal component.

6. Apparatus according to claim 5, wherein the lower edge of the plate member is positioned above the liquid surface.

7. Apparatus according to claim 5, wherein the lower edge of the plate member is positioned below the liquid surface.

8. Apparatus according to claim 3, wherein the plate member comprises a semi-cylindrical member.

9. Apparatus according to claim 3, wherein the plate member comprises a semi-elliptical member cut along a longitudinal plane including a major axis.

10. Apparatus according to claim 1, wherein the upper edge of said separating is positioned above the lower end of said feeding means.

11. An apparatus as recited in claim 1, wherein said separating means has a pair of substantially parallel side edges each spacedly positioned adjacent an inner peripheral surface of said crucible, the direction of the edges being along a central axis of the crucible.

12. An apparatus as recited in claim 1, wherein said apparatus is a single crucible apparatus.

13. An apparatus as recited in claim 1, wherein said separating means has top and bottom edges that are substantially parallel to the surface of the molten crystal component and side edges that are substantially perpendicular to the surface of the molten crystal component.

14. An apparatus as recited in claim 1, wherein a bottom edge of said separating means is positioned near the surface of the molten crystal component.

15. An apparatus as recited in claim 3, wherein said plate has an arcuate portion disposed coaxially with the crucible.

16. An apparatus as recited in claim 15, wherein said plate has two flat plate portions, one at each end of the arcuate portion, said flat plate portions being obliquely disposed toward the outer peripheral side of the arcuate plate portion.

* * * * *